(12) United States Patent
Sun et al.

(10) Patent No.: US 12,178,140 B2
(45) Date of Patent: *Dec. 24, 2024

(54) TOPOLOGICAL INSULATOR/NORMAL METAL BILAYERS AS SPIN HALL MATERIALS FOR SPIN ORBIT TORQUE DEVICES, AND METHODS OF FABRICATION OF SAME

(71) Applicant: Northeastern University, Boston, MA (US)

(72) Inventors: Nian-Xiang Sun, Winchester, MA (US); Nirjhar Bhattacharjee, Cambridge, MA (US)

(73) Assignee: Northeastern University, Boston, MA (US)

( * ) Notice: Subject to any disclaimer, the term of this patent is extended or adjusted under 35 U.S.C. 154(b) by 309 days.

This patent is subject to a terminal disclaimer.

(21) Appl. No.: 17/457,348

(22) Filed: Dec. 2, 2021

(65) Prior Publication Data

US 2022/0173307 A1 Jun. 2, 2022

Related U.S. Application Data

(60) Provisional application No. 63/120,520, filed on Dec. 2, 2020.

(51) Int. Cl.
| | | |
|---|---|---|
| *H10N 52/00* | (2023.01) | |
| *G11C 11/16* | (2006.01) | |
| *G11C 11/18* | (2006.01) | |
| *H10N 50/80* | (2023.01) | |
| *H10N 50/85* | (2023.01) | |
| *H10N 52/01* | (2023.01) | |
| *H10N 52/80* | (2023.01) | |

(52) U.S. Cl.
CPC ......... *H10N 52/101* (2023.02); *G11C 11/161* (2013.01); *G11C 11/18* (2013.01); *H10N 50/80* (2023.02); *H10N 50/85* (2023.02); *H10N 52/01* (2023.02); *H10N 52/80* (2023.02)

(58) Field of Classification Search
None
See application file for complete search history.

(56) References Cited

U.S. PATENT DOCUMENTS 6,313,392 B1 11/2001 Sato et al.
6,815,244 B2 11/2004 Boettner et al.
(Continued)

OTHER PUBLICATIONS

Slonczewski, J.C., "Current-driven excitation of magnetic multilayers", JMMM; vol. 159, Issue 1-2; pp. L1-L7 (1996).
(Continued)

*Primary Examiner* — Kevin M Bernatz
(74) *Attorney, Agent, or Firm* — Hamilton, Brook, Smith & Reynolds, P.C.

(57) ABSTRACT

A thin film heterostructure of a topological insulator (TI) with a normal metal (NM) is used as a highly energy efficient and low power dissipation spin Hall Material (SHM). The TI material is sputter deposited onto a substrate and cooled in high vacuum, and an NM material is sputter deposited onto the TI film. The structure and method is compatible with complementary metal oxide (CMOS) processes, and with growth of large-area TI films for wafer-level device fabrication.

10 Claims, 10 Drawing Sheets

(56) References Cited

U.S. PATENT DOCUMENTS

| | | | | |
|---|---|---|---|---|
| 9,024,415 | B2* | 5/2015 | Zhang | H01L 31/08 |
| | | | | 257/629 |
| 10,283,561 | B2* | 5/2019 | Wang | H10B 61/00 |
| 11,532,323 | B1* | 12/2022 | Le | H10N 50/10 |
| RE49,797 | E | 1/2024 | Nikitin et al. | |
| 11,871,679 | B2 | 1/2024 | Kalitsov et al. | |
| 11,889,702 | B2 | 1/2024 | Kalitsov et al. | |
| 11,968,905 | B2 | 4/2024 | Sun et al. | |
| 12,096,699 | B2* | 9/2024 | Sasaki | H10N 52/01 |
| 2012/0091423 | A1* | 4/2012 | Sumino | H10N 70/8836 |
| | | | | 257/E47.001 |
| 2018/0182954 | A1 | 6/2018 | Sayed et al. | |
| 2019/0058113 | A1* | 2/2019 | Ramaswamy | G11C 11/1675 |
| 2019/0147929 | A1* | 5/2019 | Sasaki | G11C 11/16 |
| | | | | 365/158 |
| 2019/0305212 | A1* | 10/2019 | Gosavi | G11C 11/1675 |
| 2020/0035910 | A1* | 1/2020 | Li | G11C 11/18 |
| 2020/0395406 | A1* | 12/2020 | Walker | H10N 50/85 |
| 2021/0249038 | A1* | 8/2021 | Le | H10B 61/00 |
| 2021/0280775 | A1 | 9/2021 | Buhrman et al. | |
| 2021/0336127 | A1 | 10/2021 | Le et al. | |
| 2021/0408370 | A1 | 12/2021 | York et al. | |
| 2022/0006005 | A1 | 1/2022 | Sun et al. | |
| 2022/0060149 | A1 | 2/2022 | Pham et al. | |
| 2022/0069202 | A1 | 3/2022 | Nguyen et al. | |
| 2022/0310901 | A1* | 9/2022 | Oguz | H10N 50/10 |
| 2023/0047223 | A1* | 2/2023 | Le | H10N 50/10 |
| 2023/0121375 | A1* | 4/2023 | Le | H10B 61/00 |
| | | | | 360/324.2 |
| 2023/0386721 | A1 | 11/2023 | Le et al. | |
| 2024/0005973 | A1 | 1/2024 | Le et al. | |
| 2024/0071450 | A1* | 2/2024 | Attane | H10N 50/80 |

OTHER PUBLICATIONS

Berger, L, "Emission of spin waves by a magnetic multilayer traversed by a current," Phys. Rev. B; 54(13); 9353-9358 (1996).
Fert, A. et al., "Spin Hall Effect Induced by Resonant Scattering on Impurities in Metals," PRL; 106:157208, pp. 1-10 (2011).
Chen, T.et al., "Spin-Torque and Spin-Hall Nano-Oscillators," Proceedings of the IEEE, vol. 104(10); 1919-1945 (2016).
Manchon, A. et al., "New perspectives for Rashba spin-orbit coupling,", Nature Materials vol. 14; 1-35 (2015).
Liu, L. et al., "Spin-Torque Switching with the Giant Spin Hall Effect of Tantalum," Science; vol. 336; pp. 1-31 (2012).
Jungfleisch, M.B. et al., "Interface-driven spin-torque ferromagnetic resonance by Rashba coupling at the interface between non-magnetic materials", Physical Review B; 93; 224419; pp. 1-5; (2016).
Mellnik, A.R., et al., "Spin-transfer torque generated by a topological insulator Bi2Se3" Nature; vol. 511; 449-451 (2014).
Belmeguenai, M. et al., "Ferromagnetic-resonance-induced spin pumping in Co20Fe60B20/Pt systems: damping investigation," J. Phys. D: Appl. Phys.; vol. 51; p. 045002-8 pp. (2018).
Thouless, D.J. et al., "Quantized Hall Conductance in a Two-Dimensional Periodic Potential," Phys. Rev. Lett.; 49(6); 405-408 (1982).
Kane, C.L. et al., "Physics: A New Spin on the Insulating State," Science, vol. 314; 1692-1693 (2006).
Hasan, M.Z. et al., "Colloquium: Topological Insulators," Rev Mod Physics; 82(4):3045-3068 (2010).
Tang, C.et al., "Dirac surface state-modulated spin dynamics in a ferrimagnetic insulator at room temperature", Sci. Adv.; vol. 4; pp. 1-6, (2018).
Mahendra D.C et al., "Room-temperature high spin-orbit torque due to quantum confinement in sputtered BixSe(1-x) films", Nature Materials; 17:800-807 (2018).

Mahendra D.C., "Room-temperature spin-to-charge conversion in sputtered bismuth selenide thin films via spin pumping from yttrium iron garnet," Appl. Phys. Lett. 114, 102401 pp. 1-6, (2019).
Guo, Q. et al., "Electrically Tunable Wafer-Sized Three-Dimensional Topological Insulator Thin Films Grown by Magnetron Sputtering," arXiv:1901; .02611; pp. 1-16 (2020).
Wang, Z.H. et al., "Granularity Controlled Nonsaturating Linear Magnetoresistance in Topological Insulator Bi2Te3 Films,", Nano Lett. 14(11); 6510-6514 (2014).
Wei, P. et al., "Exchange-Coupling-Induced Symmetry Breaking in Topological Insulators", Phy Rev Lett; 110 (18):186807-1-6 (2013).
Wang, H. et al., "Surface-State-Dominated Spin-Charge Current Conversion in Topological-Insulator/Ferromagnetic-Insulator Heterostructures", PRL; 117:076601-1-076601-13 (2016).
Kong et al., "Rapid Surface Oxidation as a Source of Surface Degradation Factor for Bi2Se3," ACS Nano 2011, 5, 6, 4698-4703.
Bhattacharjee et al., "Antiferromagnetic VdW Phase at the Interface of Sputtered Topological Insulator/Ferromagnet-Bi2Te3/Ni80Fe20 Heterostructures," arXiv:2110.02845, 2021.
Buha et al., "Thermal Stability and Anisotropic Sublimation of Two-Dimensional Colloidal Bi2 Te3 and Bi2Se3 Nanocrystals," Nano Lett. 16, 7, 4217-4223, 2016.
Emori et al., "Spin-orbit torque and spin pumping in VIG/Pt with interfacial insertion layers," Phys. Lett. 112, 182406 (2018).
Essert et al., "Using topological insulator proximity to generate perfectly conducting channels in materials without topological protection," New J. Phys. 16, 113058, 2014.
Abe et al., "Ferrite-organic multilayer film for microwave monolithic integrate circuits prepared by ferrite plating based on the spray-spin-coating method," Journal of Applied Physics 63, 3774 (1988).
Katmis et al., "A high-termperature ferromagnetic topological insulting phase by proximity coupling," Nature, vol. 533, May 26, 2016, 12 pages.
Kim et al., "Understanding the Giant Enhancement of Exchange Interaction in Bi2Se3—EuS Heterostructures," Physical Review Letters, PRL 119, 027201 2017.
Lee et al., "Enhanced spin-orbit torque via interface engineering in Pt/CoFeB/MgO heterostructures," APL Mater. 7, 031110, 2019.
Liu, et al., "Spin-polarized tunneling study of spin-momentum locking in topological insulators," Phys. Rev. B 91, 235437, 2015.
Shoman et al., "Topological proximity effect in a topological insulator hybrid," Nature Comm 6:6547, 2015.
Abe et al., "Ferrite-Plating in Aqueous Solution: A New Method for Preparing Magnetic Thin Film," Japanese Journal of Applied Physics, vol. 22, No. 8, Aug. 1983, pp. L511-L513.
N. Bhattacharjee et al., EL03.06.29 : Enhanced Gilbert Damping in Sputter Deposited Topological Insulator/ Ferromagnet Heterostructures, MRS 2019.
Wu et al., "Room-Temperature Spin-Orbit Torque from Topological Surface States," PRL 123, 207205 (2019).
Zhu, et al., "Maximizing Spin-Orbit-Torque Efficiency of Pt/Ti Multilayers: Trade-Off Between Intrinsic Spin Hall Conductivity and Carrier Lifetime," Physcial Review Applied 12, 051002 (2019).
Zutic et al., "Proximitized materials," Materials Today, vol. 22, pp. 85-107, 2019.
Siegal et al., "Correlating thermoelectric properties with microstructure in Bio.aSbo.2 thin films," APL 110, 141905, 2017.
Notice of Allowance received for U.S. Appl. No. 17/365,779, mailed on Feb. 14, 2024, 8 pages.
Dolui et al. ("Effective spin-mixing conductance . . . Green function approach", Phys. Rev. Mat., 4, 121201 (R), 2020. (Year: 2020).
Non-Final Office Action received for U.S. Appl. No. 17/365,779, mailed on Oct. 4, 2023, 15 pages.
Requirement for Restriction/Election received for U.S. Appl. No. 17/365,779, mailed on Jun. 8, 2023, 5 pages.

* cited by examiner

FIG. 2A (PRIOR ART)    FIG. 2B (PRIOR ART)
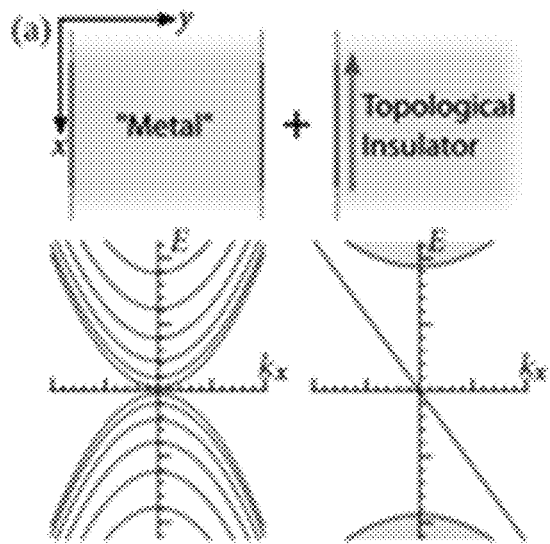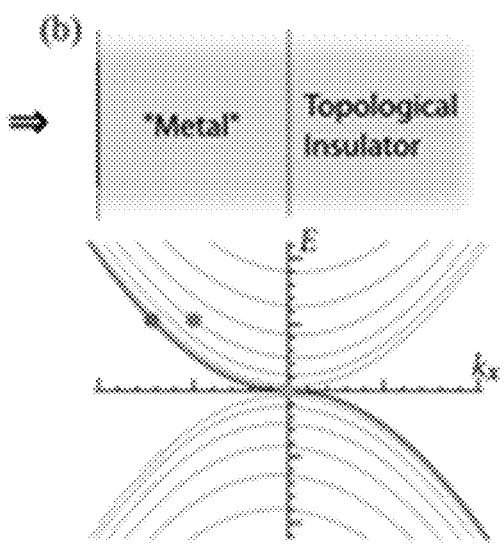
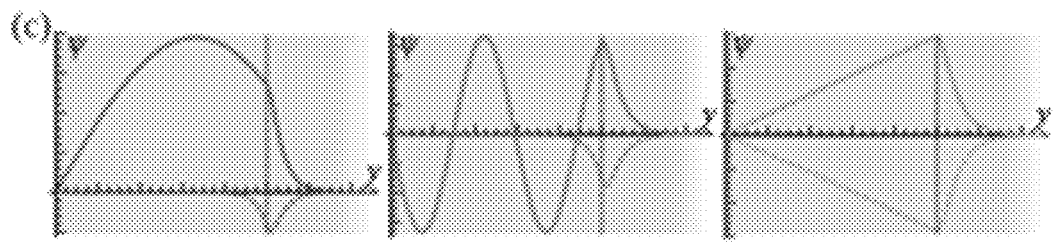
FIG. 2C (PRIOR ART)

TOPOLOGICAL INSULATOR/NORMAL METAL BILAYERS AS SPIN HALL MATERIALS FOR SPIN ORBIT TORQUE DEVICES, AND METHODS OF FABRICATION OF SAME

RELATED APPLICATION

This application claims the benefit of U.S. Provisional Application No. 63/120,520, filed on Dec. 2, 2020. The entire teachings of the above application are incorporated herein by reference.

GOVERNMENT SUPPORT

This invention was made with government support under Grant No. W911NF-20-P-0009 awarded by the Army Research Office. The government has certain rights in the invention.

BACKGROUND

Current driven magnetization oscillations were first proposed by Slonzewski [1] and Berger [2] in 1996, which formed the basis of research on spin torque nano-oscillators (STNO) and magnetic random-access memories (MRAMS). This class of devices utilize the torque provided by non-collinear spin currents with respect to magnetization direction in a ferromagnet (FM) or antiferromagnet (AFM) to excite spin dynamics. With the understanding of the spin-Hall effect (SHE) [3], different spin Hall materials (SHM) with high spin-orbit coupling (SOC) coupled with magnetic layers could be characterized to study the efficiency of charge-spin current interconversion. The SHE can be quantified using the parameter spin-Hall angle (OSH), which is proportional to the ratio of spin current to charge current densities. The higher the OSH is for a certain normal metal (or material) (NM), the higher the spin current that can be generated from SHE and consequently, lower the charge current required to generate magnetization dynamics in the adjacent FM or AFM. The spin current can exert a high enough torque in the magnetization of the adjoining FM or AFM to enable resonant excitation or switching [4].

SOC arising from relativistic interaction of a particle's spin with its motion inside an electric potential ($\vec{B} \propto \vec{v} \times \vec{E}$) has been known to be responsible for interesting electronic properties in SHMs such as proximity induced magnetization [5, 6, 7], SHE, and Rashba-Edelstein Effect (REE). SOC gives rise to spin-dependent scattering in certain materials (SHE) and spin-momentum locking in 2D electron gas (2DEG) systems in thin-film interfaces (REE) attributed to the topology of the band structure. These effects have been reported in the literature [8,9], which provide additional torques (field-like and damping-like) to an adjacent magnetic material to excite dynamic magnetization behavior and switching.

The class of 3D topological insulators (TI) such as $Bi_2Se_3$, $Bi_2Te_3$ and their family have been shown to possess robust surface conducting states as a consequence of the topologically nontrivial band structure of these materials, which provide enhanced spin accumulation and an unusually large $\theta_{SH}$ [10-12] when coupled with a FM or AFM material. The TI in turn injects an unusually high spin-orbit torque (SOT) in the FM layer to excite magnetization dynamics using a relatively lower current density compared to heavy metals such as Pt, Ta or W. These exciting results are very relevant for the memory and logic device industry as they open the path towards highly efficient SOT-MRAMs and STNOs.

SUMMARY

A thin film heterostructure of a topological insulator (TI) with a normal metal (NM) is used as a highly energy efficient and low power dissipation spin Hall Material (SHM). The TI material may be sputter deposited onto a substrate and cooled in high vacuum, and an NM material may be sputter deposited onto the TI film. The structure and method is compatible with complementary metal oxide (CMOS) processes, and with growth of large-area TI films for wafer-level device fabrication.

In one embodiment according to the invention, there is provided a thin film heterostructure material for a spin orbit torque device. The material comprises a topological insulator sputter deposited on a substrate, and a normal metal sputter deposited in proximity to the topological insulator. The topological insulator and normal metal together are configured to provide spin-orbit torque to an adjacent ferromagnetic material sufficient to produce at least one of resonant excitation and switching of magnetization in the ferromagnetic material.

In further related embodiments, the topological insulator may comprise a first element comprising at least one of bismuth and antimony, and a second element comprising at least one of tellurium and selenium. The topological insulator may comprise bismuth telluride ($Bi_2Te_3$), and the normal metal may comprise at least one of titanium and copper. The normal metal may comprise a thickness that is sufficiently thick to prevent diffusion of material from the ferromagnetic material into the topological insulator towards the substrate, while the thickness is also sufficiently thin to permit spin orbit coupling of the heterostructure material with the adjacent ferromagnetic material. For example, the normal metal may comprise a thickness that is greater than about 1 nm and less than about 5 nm. The thin film heterostructure material may further comprise a magnetic insulator or antiferromagnetic insulator spin-spray deposited on the heterostructure material. The ferromagnetic material may, for example, comprise at least one of cobalt ferrite boron (CoFeB), and a material comprising nickel and iron. The thin film heterostructure material may further comprise the ferromagnetic material, which may comprise at least a portion of a nonvolatile memory device, such as a Magnetic Random Access Memory (MRAM) device, and may comprise at least a portion of a Complementary Metal Oxide Semiconductor (CMOS) device.

In another embodiment according to the invention, there is provided a method of processing a thin film heterostructure material. The method comprises performing a physical vapor deposition sputtering on a substrate to thereby obtain a topological insulator sputter deposited on the substrate; and sputter depositing a normal metal in proximity to the topological insulator to thereby configure the topological insulator and normal metal together to provide spin-orbit torque in an adjacent ferromagnetic material sufficient to produce at least one of resonant excitation and switching of magnetization in the ferromagnetic material.

In further related embodiments, the depositing of the normal metal may be performed without breaking a vacuum used to perform the physical vapor deposition sputtering of the topological insulator, and may be performed after cooling the deposited topological insulator on the substrate to room temperature. The physical vapor deposition sputtering to obtain the topological insulator on the substrate may be performed at a temperature of about 250° C. The method may further comprise performing at least a portion of a Complementary Metal Oxide Semiconductor (CMOS) manufacturing process, and may comprise forming at least a portion of a nonvolatile memory device. The topological insulator may comprise a first element comprising at least one of bismuth and antimony, and a second element comprising at least one of tellurium and selenium. The normal metal may comprise at least one of titanium and copper. The method may further comprise spin-spray depositing a magnetic insulator or antiferromagnetic insulator on the heterostructure material.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIGS. 2A-2C are schematic diagrams showing, in FIGS. 2A and 2B, proximity induced topological hybridization of band structure of NM from adjacent TI layer; in FIG. 2C, wave-function in proximitized NM with TI for different energies corresponding to points marked in FIG. 2B, in accordance with the prior art [20], Essert et al., New J. Phys. 16, 113058, 2014.

FIG. 6A is a graph showing damping enhancement with an ultrathin Ti insertion layer. FIG. 6B is a graph showing the trend in Gilbert damping a values due to spin pumping with Ti insertion layer thickness.

FIG. 7A shows layers of $Bi_2Te_3$ and Py (an NiFe substance), along with an Ni:$Bi_2Te_3$ interface layer, at a scale of 20 nm; FIG. 7B shows the layers at a scale of 5 nm; and FIG. 7C is a graph of counts (a.u.) versus depth (nm) of Ni, Fe, Te, and Bi.

DETAILED DESCRIPTION

A description of example embodiments follows.

Introduction

There is here proposed a thin film heterostructure of a topological insulator (TI) with a normal metal (NM) that can be used as a highly energy efficient and low power dissipation spin Hall Material (SHM). The TI material is sputter deposited onto a substrate and cooled in high vacuum, and an NM material is sputter deposited onto the TI film. The structure and method is compatible with complementary metal oxide (CMOS) processes, and with growth of large-area TI films for wafer-level device fabrication.

Experimental results and background are discussed below, in connection with FIGS. 1-9B.

Figure 10A:
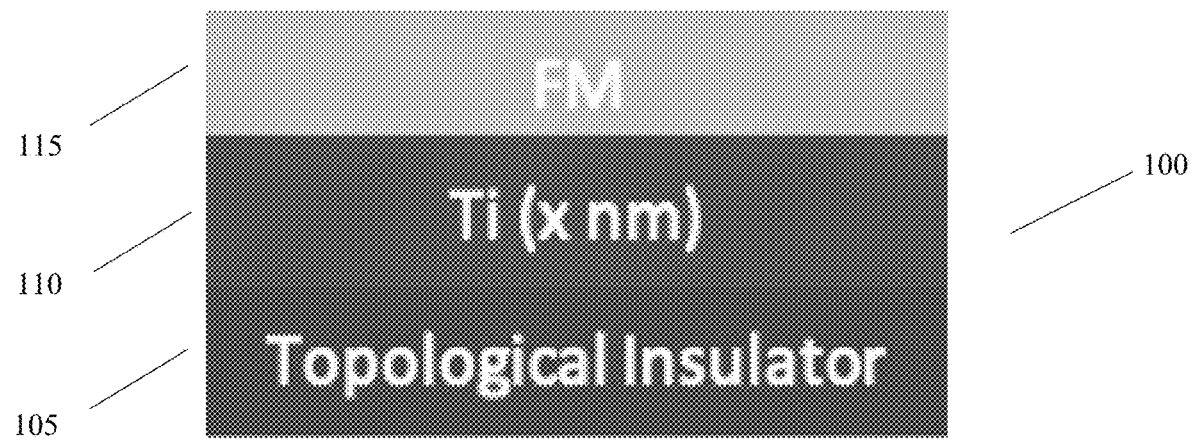
FIG. 10A is a schematic diagram showing a topological insulator/normal metal bilayer configured as a Spin Hall Material (SHM), in accordance with an embodiment of the invention.

FIG. 10A is a schematic diagram showing a topological insulator/normal metal bilayer configured as a Spin Hall Material (SHM), in accordance with an embodiment of the invention. The thin film heterostructure material 100 for a spin orbit torque device includes a topological insulator 105 sputter deposited on a substrate (not shown in FIG. 10A), and a normal metal 110 sputter deposited in proximity to the topological insulator 105. The topological insulator 105 and normal metal 110 together are configured to provide spin-orbit torque to an adjacent ferromagnetic material 115 sufficient to produce at least one of resonant excitation and switching of magnetization in the ferromagnetic material 115. The switching of the magnetization in the ferromagnetic material 115 can be efficient switching, so that magnetization switching can be achieved using lower power compared to other materials. The topological insulator 105 can, for example, include a first element comprising at least one of bismuth and antimony, and a second element comprising at least one of tellurium and selenium; for example, the topological insulator 105 can belong to the family $(Bi,Sb)_2(Te,Se)_3$. In one example, the topological insulator 105 can be bismuth telluride ($Bi_2Te_3$), or another $Bi_xTe_{(1-x)}$ material, for x being a suitable value with 0<x<1. The normal metal 110 can, for example, be at least one of titanium and copper, and can have a thickness that is sufficiently thick to prevent diffusion of material from the ferromagnetic material 115 into the topological insulator 105 towards the substrate (positioned, for example, beneath the topological insulator 105 shown in FIG. 10A), while the thickness is also sufficiently thin to permit spin orbit coupling of the heterostructure material 100 with the adjacent ferromagnetic material 115. For example, the normal metal 110 can have a thickness that is greater than about 1 nm and less than about 5 nm. Although the normal metal 110 is represented in FIG. 10A as titanium, it will be appreciated that other metals can be used, for example copper; and the thickness of the normal metal 110, indicated as "x" nm, can for example be between 1 nm and 5 nm, such as 1 nm, 2 nm, or 3 nm. The ferromagnetic material 115 can, for example, comprise at least one of cobalt ferrite boron (CoFeB), and a material comprising nickel and iron, for example an $Ni_xFe_y$, for suitable values of x and y. The thickness of the ferromagnetic material 115 can, for example, be less than about 10 nm. The ferromagnetic material 115 can be part of a nonvolatile memory device, such as a Magnetic Random Access Memory (MRAM) device, and can be part of a Complementary Metal Oxide Semiconductor (CMOS) device. The substrate can, for example, be or include amorphous silicon, although other materials can be used, such as $SiO_2$ (in a manner similar to the $SiO_2$ layer shown in FIG. 7A).

In an embodiment a method of processing a thin film heterostructure material 100 includes performing a physical vapor deposition sputtering on a substrate to thereby obtain a topological insulator 105 sputter deposited on the substrate; and sputter depositing a normal metal 110 in proximity to the topological insulator 105 to thereby configure the topological insulator 105 and normal metal 110 together to provide spin-orbit torque in an adjacent ferromagnetic material 115 sufficient to produce at least one of resonant excitation and switching of magnetization in the ferromagnetic material 115. The depositing of the normal metal 110 can be performed without breaking a vacuum used to perform the physical vapor deposition sputtering of the topological insulator 105, and can be performed after cooling the deposited topological insulator 105 on the substrate to room temperature. The physical vapor deposition sputtering to obtain the topological insulator 105 on the substrate can, for example, be performed at a temperature of about 250° C. The method can further include performing at least a portion of a Complementary Metal Oxide Semiconductor (CMOS) manufacturing process, and can include forming at least a portion of a nonvolatile memory device. The method can further include spin-spray depositing a magnetic insulator 120 (see FIG. 10B) or antiferromagnetic insulator on the heterostructure material.

Figure 10B:
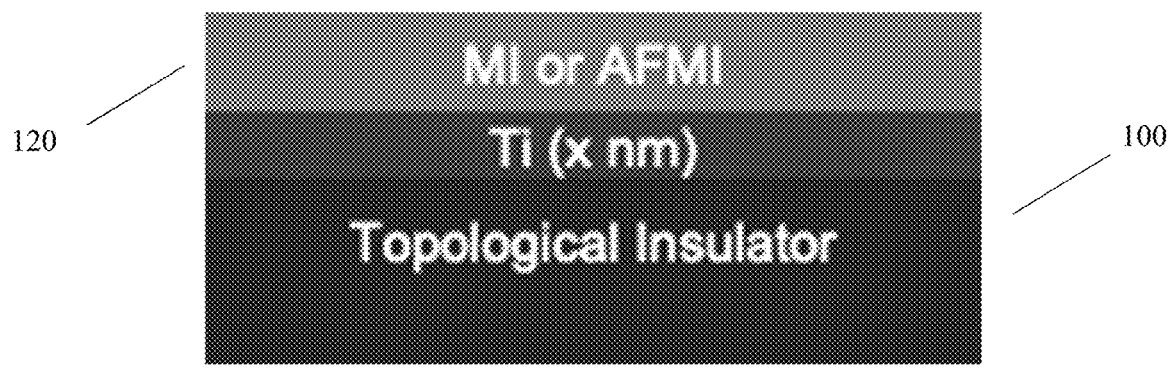
FIG. 10B is a schematic diagram showing a topological insulator/normal metal heterostructure with a magnetic insulator (MI) or antiferromagnetic insulator (AFMI), configured as a Spin Hall Material (SHM), in accordance with an embodiment of the invention.

FIG. 10B is a schematic diagram showing a topological insulator/normal metal heterostructure with a magnetic insulator (MI) or antiferromagnetic insulator (AFMI), configured as a Spin Hall Material (SHM), in accordance with an embodiment of the invention. In this example, the thin film heterostructure material 100 includes a magnetic insulator 120 or antiferromagnetic insulator spin-spray deposited on the heterostructure material.

Reliability in Topological Insulator (TI) Based Spin Orbit Torque (SOT) Devices

There have been contradictory reports in the scientific literature about power dissipation in SOT devices. Zhu et al. [13] reported higher power-dissipation in TIs as SHMs compared to HM (heavy metals such as Pt, Ta, etc.) based systems. In contrast, Wu et al. [14] have reached opposite conclusions from their SOT induced magnetization switching experiments. The discrepancies in the studies arise from the difference in device structure considered for SOT switching analysis. Zhu et al. [13] have used a pattern with a longer SHM channel carrying injection current compared to the FM layer, which results in over-estimation of power dissipation, and misleading conclusions.

The damping like SOT efficiency in TIs per unit bias current density given by $\xi_{DL}^j = T_{int}\theta_{SH}$ is significantly higher than HM based spin-Hall materials (SHM). Here, $T_{int} \leq 1$ is the spin transparency of the interface and $\theta_{SH}$ is the spin Hall angle. This results in an order of magnitude lower critical switching current density, $j_c$ and power dissipation in TIs regardless of their resistivity, $\rho_{xx}$ which is 2-3 orders of magnitude higher than HMs [11, 14].

Even though the lowest recorded switching currents and power dissipation has been reported in TI based SOT devices, nevertheless they are expected to suffer from potential reliability issues due to phase transformation at high temperatures. E.g., Bi based TI systems melt or sublimate at temperatures higher than 280° C.-300° C. [15,16]. Moreover, Bhattacharjee et al. [17] recently showed diffusion of magnetic species such as Ni across TI/FM interface to form complexes which changes the nature of the heterostructure.

Figure 1:
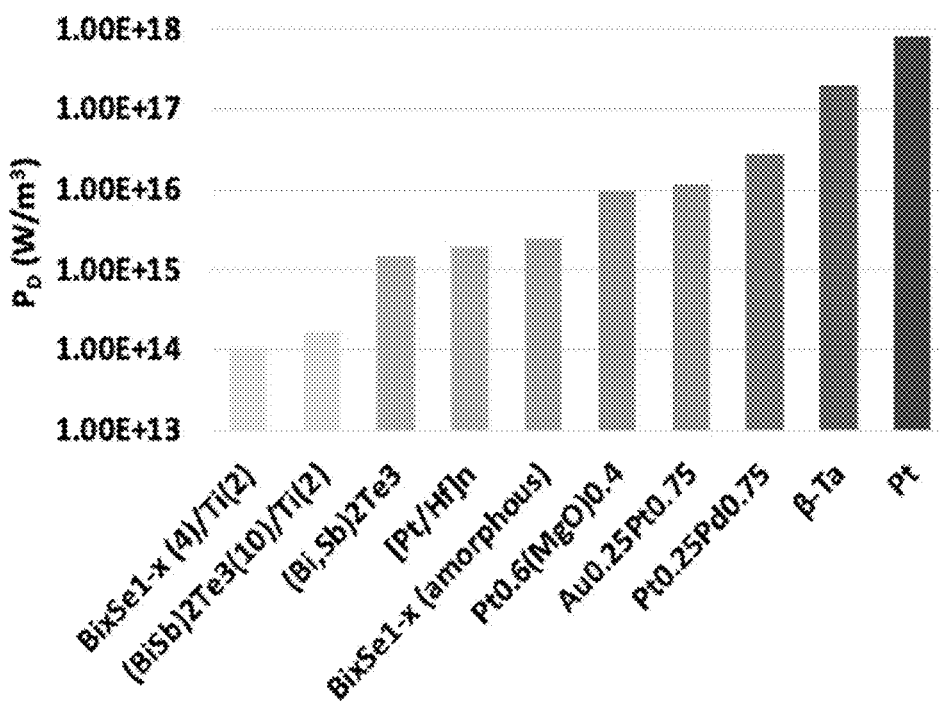
FIG. 1 is a graph showing estimated power dissipation, $P_D$ of different SHMs (spin Hall materials) used in current induced SOT devices in W/m³, showing that Ti insertion on TI leads to ~1 order of magnitude reduced power dissipation due to enhanced conductivity and high SOT.

Our proposed approach of utilizing SOC proximitized NM with TI as SHM is estimated to drastically reduce power dissipation, $P_D = j_c^2 \rho_{xx}$ in SOT devices due to dramatic reduction in effective resistivity of the bilayer given by, $$\rho_{eff} = \frac{\frac{\rho_{TI}\rho_{NM}}{t_{TI}t_{NM}}}{\frac{\rho_{TI}}{t_{TI}} + \frac{\rho_{NM}}{t_{NM}}} t_{eff}$$

without significantly compromising $\theta_{SH}$ and $j_c$. These proximity induced SOC effects are however, largely absent or negligible in HM based SHMs [18] which gives TI materials a significant advantage in engineering highly efficient SOT devices. The $\rho_{xx}$, $\xi_{DJ}$, $j_c$ and $P_D$ values of some commonly studied SHMs are listed in Table 1, and compared in FIG. 1. Here, $\rho_{TI}$ and $\rho_{NM}$ are the resistivities of TI and NM layers respectively and $t_{eff}$ is the total thickness of the bilayer structure. FIG. 1 is a graph showing estimated power dissipation, $P_D$ of different SHMs (spin Hall materials) used in current induced SOT devices in $W/m^3$, showing that Ti insertion on TI leads to ~1 order of magnitude reduced power dissipation due to enhanced conductivity and high SOT [13, 14].

Table 1 shows a comparison of $\rho_{xx}$, $\xi_{DJ}$, $j_c$ and $P_D$ for SHMs in SOT applications, showing a significantly reduced power dissipation density $P_D$ for TI/NM (Ti) as SHM [13, 14].

TABLE 1

| Spin Hall Material (SHM) | $\rho_{SHM}$ (μΩ cm) | $\xi_{DL}$ | $j_c$ (A/cm²) | $P_D$ (W/m³) |
|---|---|---|---|---|
| $Bi_xSe_{1-x}$ (4)/Ti(2) [Proposed] | 582.09 | 18.6 | 4.30E+05 | 1.08E+14 |
| $(BiSb)_2Te_3(5)/Ti(2)$ [Proposed] | 641.27 | 2.5 | 5.20E+05 | 1.73E+14 |
| $(Bi,Sb)_2Te_3$ | 5460 | 2.5 | 5.20E+05 | 1.48E+15 |
| $[Pt/Hf]_n$ | 144 | 0.37 | 3.60E+06 | 1.87E+15 |
| $Bi_xSe_{1-x}$ (amorphous) | 13000 | 18.6 | 4.30E+05 | 2.40E+15 |
| $Pt_{0.6}(MgO)_{0.4}$ | 74 | 0.3 | 1.15E+07 | 9.79E+15 |
| $Au_{0.25}Pt_{0.75}$ | 83 | 0.35 | 1.20E+07 | 1.20E+16 |
| $Pt_{0.25}Pd_{0.75}$ | 56.5 | 0.26 | 2.20E+07 | 2.73E+16 |
| β-Ta | 190 | 0.12 | 3.20E+07 | 1.95E+17 |
| Pt | 20 | 0.055 | 2.00E+08 | 8.00E+17 |

Our proposed approach on TI/NM as SHM leads to further reduction in power dissipation for SOT devices, which is an order of magnitude lower than TIs, and 3-4 orders of magnitude lower than that HM, such as Pt or Ta.

Topological Proximity Effect in Normal Metal (NM) Coupled to Topological Insulator (TI)

Due to the presence of enormous SOC, TIs possess gapless surface conducting states which enable spin momentum locked electron transport, which are topologically protected against scattering. The presence of a TI adjacent to a metallic layer hybridizes the band structure of metal [19]. This gives rise to topologically protected, and spin-momentum locked electronic transport properties being induced in the metallic layer beyond the interface boundary. The proximity induced electronic properties resulting from hybridization of band structure are more complex in metals compared to insulators due to the presence of conduction electrons and electron-electron interactions. Essert et al., [20] using quantum transport calculations showed the presence of perfectly conducting channels (PCC) induced in an NM due to the presence of an adjacent TI, as shown in FIGS. 2A-2C. FIGS. 2A-2C are schematic diagrams showing, in FIGS. 2A and 2B, proximity induced topological hybridization of band structure of NM from adjacent TI layer; in FIG. 2C, wave-function in proximitized NM with TI for different energies corresponding to points marked in FIG. 2B. Experimental verification of topological proximity effect was reported in TlBi$_2$Se$_3$/Bi heterostructures using Angle Resolved Photoemission Spectroscopy (ARPES) by Shoman et al. Migration of surface states to the NM layer and hybridizing with Rashba spin split states was reported [21]. An ultrathin metallic insertion layer is expected to possess quantum well states because of quantum confinement. Lack of spatial inversion symmetry due to the presence of two materials with different chemical potentials (TI and MI) on the two sides of an ultrathin NM induces Rashba spin-splitting in the quantum well band structure of the NM [5]. This ultrathin NM quantum well is expected to experience a giant Rashba spin-splitting which makes it an optimal heterostructure for use in SOT devices. Theoretical calculations also show enhanced Rashba spin-splitting not only in ultrathin Ag coupled to a TI but the effect extends to far higher thickness (~12 nm) due to topological proximity effect and its highly nonlinear behavior. This makes TI/NM bilayer structures a fascinating system to study and optimal for TI based SOT device applications.

Issues with Growth of Magnetic Insulators (MI) on Topological Insulators (TI)

Conventional MI deposition processes such as pulsed laser deposition (PLD), MBE or PVD technologies need extremely high temperatures (>700° C.) for forming high crystalline quality ferrite materials. Spin-spray deposition process for ferrite films was invented by Dr. M. Abe at Tokyo Inst. of Tech. in the 1980's [22,23] which makes it suitable for deposition on TIs for spintronic devices based on MIs. It involves direct deposition of ferrites from an aqueous solution at low temperatures between 24-100° C. in as-deposited state. But, this kind of low temperature MI deposition technique requires the surface of the substrate to be exposed to atmosphere as the process is not carried out inside vacuum. TI thin films surfaces on exposure to atmosphere turn into trivial insulators because of surface oxidation [24]. The oxidized TI surface is expected to possess negligible spin-splitting, which is a concern while using spin-spray or other FM deposition techniques that involve sample exposure to the atmosphere. Using a proximitized NM on TI also protects the surface from degrading during spin spray ferrite deposition process which opens another avenue for TI/MI based SOT devices.

Experimental: Growth of TI/NM Heterostructures Using Sputtering

Molecular beam epitaxy (MBE) process conventionally used for growing single-crystal TI thin films has a low growth rate. It also requires high deposition temperatures which are incompatible with industrial complementary metal oxide (CMOS) processes. Further, chemical vapor deposition (CVD) process possesses difficulty in growing large-area TI films [8], which is needed for wafer-level device fabrication. Physical vapor deposition (PVD) or sputtering has been the most popular thin film growth technique in the semiconductor industry because of its high growth rate, low cost, and the available degrees of freedom in terms of controlling thin-film properties, such as angstrom level thickness, stoichiometric composition and crystallinity.

Figure 3:
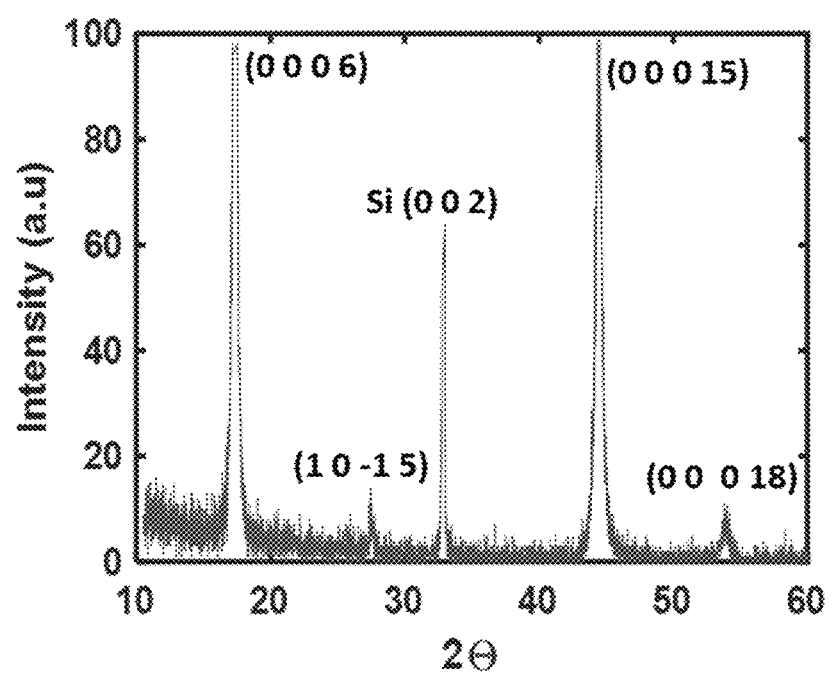
FIG. 3 shows XRD peaks of sputtered TI $Bi_2Te_3$ films grown at 250° C. on thermally oxidized Si, in an experiment in accordance with an embodiment of the invention.

We have developed a process to grow sputtered TI films by controlling the deposition conditions [25]. A composite Bi$_2$Te$_3$ target was co-sputtered with a Te target using RF magnetron sputtering at 100 W and 4 mT pressure and substrate temperature at 160-250° C. The base pressure was recorded to be ~1×10$^{-7}$ Torr. By controlling the process temperature, the degree of crystallinity of the TI film was controlled. Alternatively, a composite Te rich target such as Bi$_{30}$Te$_{70}$ can also be used to compensate for the low vapor pressure Te. X-ray diffraction measurements showed amorphous films at room temperature (~30° C.), but enhanced crystallinity with increased process temperatures from 160° C. to 250° C. FIG. 3 shows XRD peaks of sputtered TI Bi$_2$Te$_3$ films grown at 250° C. on thermally oxidized Si, in an experiment in accordance with an embodiment of the invention. The NM layer (Ti in this case) was deposited after cooling the Bi$_2$Te$_3$ TI film to room temperature using DC magnetron sputtering at 50 W power and 3 mT pressure.

Figure 4A:
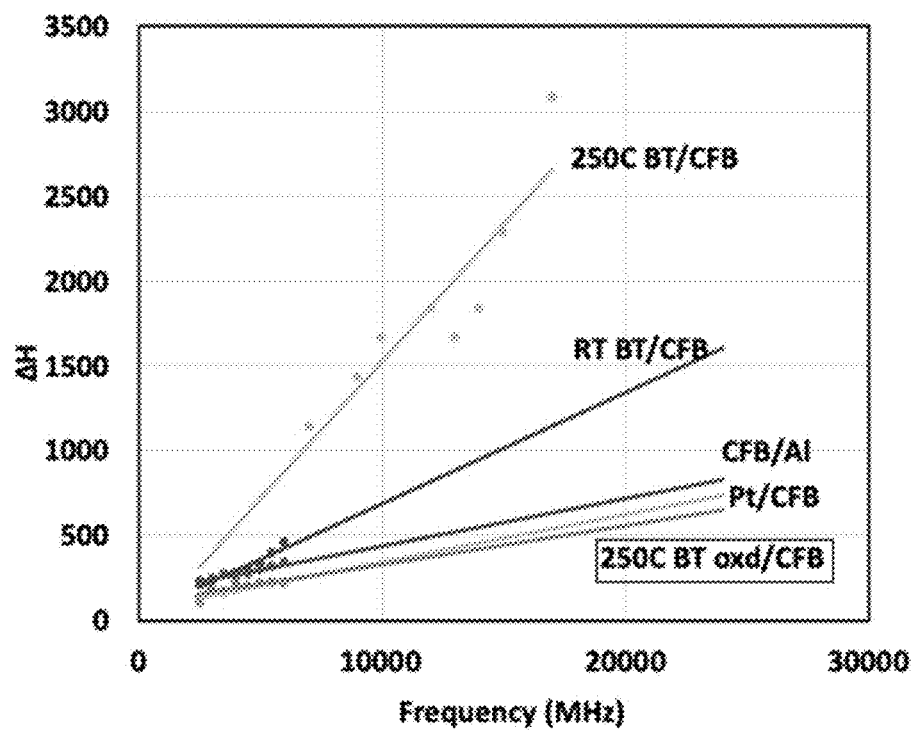
FIG. 4A is a graph showing FMR linewidth vs frequency plots for $Bi_2Te_3$ and Pt with 5 nm of ferromagnet, CoFeB film showing suppression of Gilbert damping enhancement on exposure of $Bi_2Te_3$ to atmosphere, in an experiment in accordance with an embodiment of the invention.
Figure 4B:
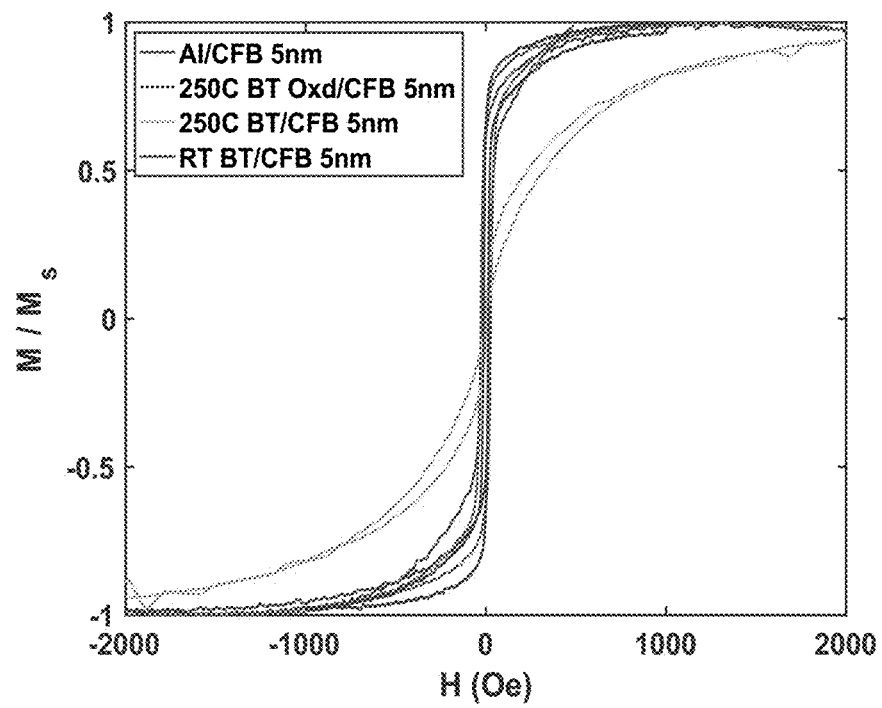
FIG. 4B is a graph showing hysteresis loop measurement using VSM of BT(10 nm)/CFB(5 nm) heterostructures showing OOP magnetic anisotropy for sample with crystalline BT, in an experiment in accordance with an embodiment of the invention.

Experimental: Observation of Suppression of SOC Effects in TI Due to Surface Oxidation Bi based TI materials on exposure to atmosphere turn into trivial insulators because of surface oxidation [24]. The oxidized TI is expected to possess negligible SOC, which is a concern when using low temperature spin-spray MI deposition techniques that involve sample exposure to the atmosphere. We observed complete suppression of Gilbert damping enhancement when the BT film was exposed to the atmosphere before deposition of 5 nm of CFB. The configuration of the samples studied are: 250° C. BT(20 nm)/CFB(CFB)(5 nm)/Al(3 nm); 250° C. BT(20 nm) (oxidized in atmosphere)/CFB(5 nm)/Al(3 nm); RT BT(20 nm)/CFB(5 nm)/Al(3 nm); Pt(20 nm)/CFB(5 nm)/Al(3 nm); Al(10 nm)/CFB(5 nm)/Al(3 nm) (Control). Whereas the Gilbert damping coefficient for 250° C. BT/CFB sample was calculated using the equation $$\Delta H_{pp} = \Delta H_{pp,0} + \frac{2}{\sqrt{3}} \frac{f}{\gamma} \alpha$$

to be α=0.1614, the 250° C. BT (oxidized in atmosphere)/CFB had α=0.06, which was almost the same as the control sample Al/CFB/Al, as shown in FIG. 4A. FIG. 4A is a graph showing FMR linewidth vs frequency plots for Bi$_2$Te$_3$ and Pt with 5 nm of ferromagnet, CoFeB film showing suppression of Gilbert damping enhancement on exposure of Bi$_2$Te$_3$ to atmosphere, in an experiment in accordance with an embodiment of the invention. Spin-mixing conductance calculated using the relation, $g_{\uparrow\downarrow}=4\pi M_s t_{FM} \Delta\alpha/g\mu_B$ was 1.28×10$^{21}$ m$^{-2}$ for the 250° C. BT/CFB and 3.62×10$^{20}$ m$^{-2}$ for RT BT/CFB, much higher than $g_{\uparrow\leftarrow}$=1.92×10$^{18}$ m$^{-2}$ for the Pt/CFB sample. The $g_{\uparrow\leftarrow}$ value for 250 C BT(oxidized in atmosphere)/CFB, which was exposed to atmosphere before deposition of CFB was ~0. In addition to spin pumping, out of plane (OOP) anisotropy observed in the crystalline TI/CFB sample for low thickness (<10 nm) of CFB was also suppressed in the crystalline TI exposed to the atmosphere as shown in FIG. 4B. FIG. 4B is a graph showing hysteresis loop measurement using VSM of BT(10 nm)/CFB(5 nm) heterostructures showing OOP magnetic anisotropy for sample with crystalline BT, in an experiment in accordance with an embodiment of the invention.

Experimental: Protection of High-Quality TI Surface with Capping

Figure 5:
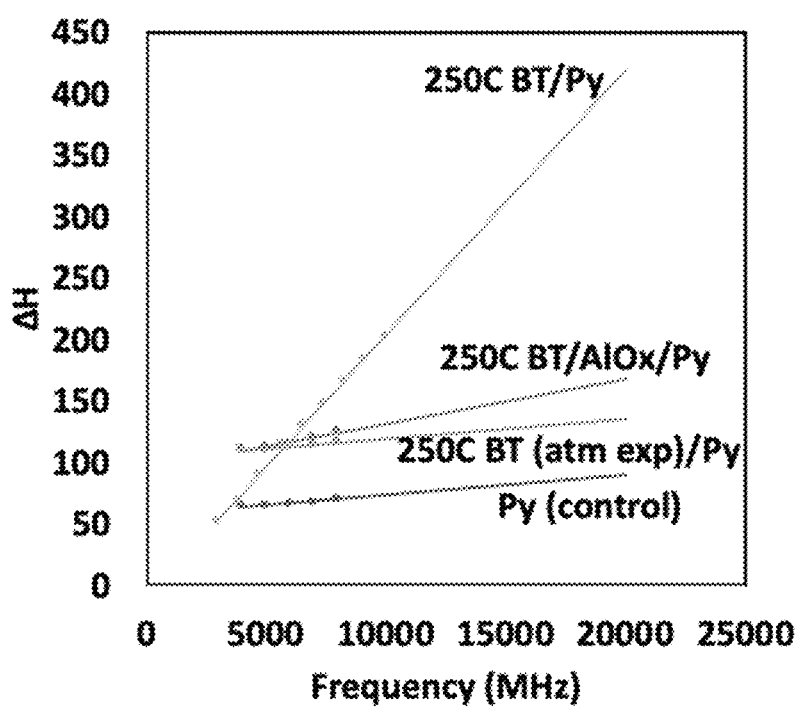
FIG. 5 is a graph showing FMR results of 250° C. $Bi_2Te_3$/NiFe samples, in an experiment in accordance with an embodiment of the invention.

Liu et al., reported spin-polarized tunneling mediated switching of magnetization from TI layer [26]. An ultrathin dielectric tunnel barrier layer on TI acts as a cap protecting the surface from degradation due to oxidation and also, acts a tunnel barrier for spin transport. In order to test the hypothesis, we grew the following samples: 250° C. BT(20 nm)/NiFe (16 nm)/Al(3 nm); 250° C. BT(20 nm) (oxidized in atmosphere)/NiFe(16 nm)/Al(3 nm); 250° C. BT(20 nm)/Al (2 nm, oxidized in atmosphere)/NiFe (16 nm)/Al(3 nm); Al(10 nm)/NiFe (16 nm)/Al(3 nm) (Control) on Si/SiO$_2$ substrate. The sample with Al cap when exposed to atmosphere oxidizes to AlO$_x$. The FMR results shown in FIG. 5, confirms the regaining of spin pumping effect in TI/barrier/FM heterostructures. FIG. 5 is a graph showing FMR results of 250° C. Bi$_2$Te$_3$/NiFe samples, in an experiment in accordance with an embodiment of the invention. Finite spin pumping achieved using AlO$_x$ as tunnel barrier between 250° C. BT and NiFe. The Gilbert damping enhancement in the sample with BT/AlO$_x$ cap was 0.005 compared to ~0 when the BT layer was exposed to the atmosphere. The Gilbert damping enhancement in 250° C. BT/CFB sample was however significantly larger ($\alpha$=0.052) due to coupling with the TI layer as expected. The $g_{\uparrow\downarrow}$ values for the samples calculated are: $2.31\times10^{20}$ m$^{-2}$, 0, $2.24\times10^{19}$ m$^{-2}$ for the 250° C. BT, 250° C. BT (exposed to atmosphere) and RT BT samples respectively, which suggests finite spin pumping through the native AlO$_x$ tunnel barrier.

These results above demonstrate the need for protecting TI surfaces before exposure to the atmosphere. TI surface is usually capped with Se or Te, which can be evaporated by heating in a high vacuum before growing FM layer in SOT devices. The presence of high-quality capping layer becomes especially significant for successfully growing low-temperature spin-spray ferrites on TI as substrates are exposed to the atmosphere during deposition. The choice of capping/barrier layer is essential as spin current must not be diminished through the barrier for efficient SOT device applications.

Figure 6A:
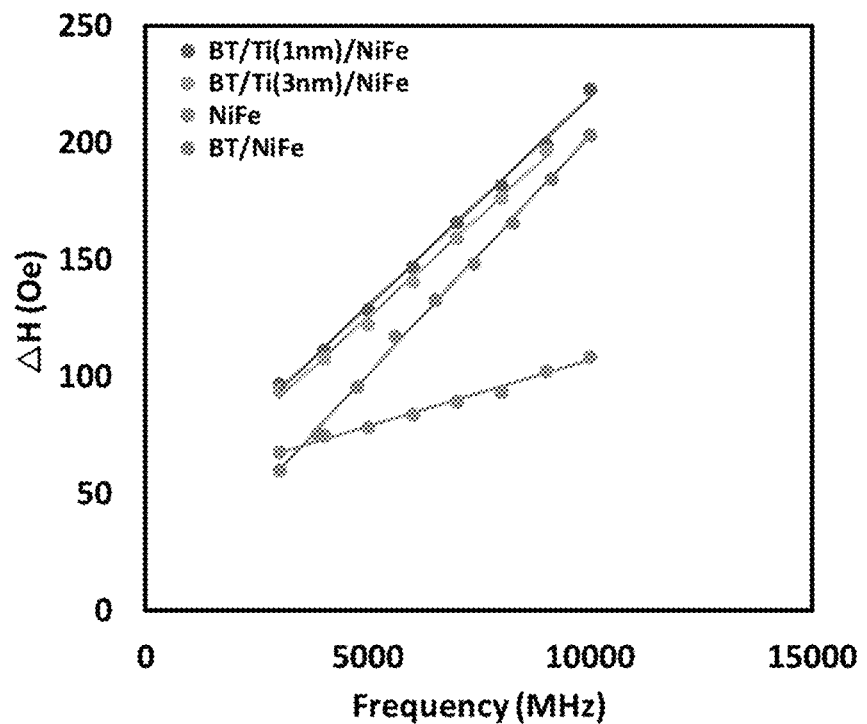
FIGS. 6A and 6B are graphs showing improvement in spin pumping using NM insertion layers in accordance with an embodiment of the invention.
Figure 6B:
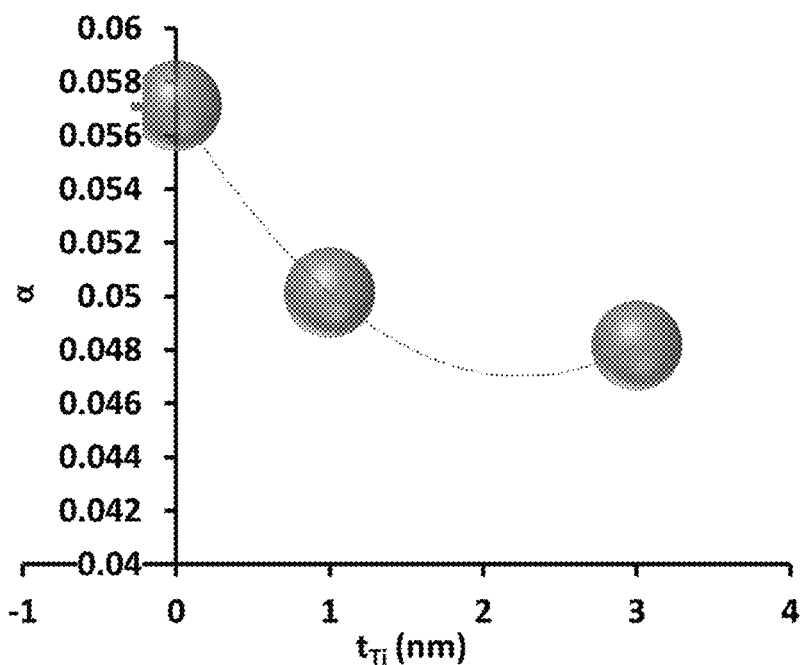

Experimental: Enhancement of Linewidth in TI/NM/FM Heterostructures—Spin-Pumping Enhancement of SOT efficiency with 1 nm Ti insertion layers in heavy metal (HM)/FM heterostructures was reported by Lee et al., [27]. In order to understand the effects of the NM insertion layers in our sputtered TI/FM heterostructures, we grew crystalline BT as reported earlier, followed by ultrathin insertion layers of Ti as the NM: BT(10 nm)/Ti(x=1, 2, 3 nm). The BT/Ti samples were exposed to the atmosphere to mimic the condition of low temperature spin-spray ferrite film growth on TI before depositing a 16 nm NiFe film to characterize spin pumping effects in BT/Ti bilayers. NiFe (16 nm) and BT/NiFe (16 nm) (without breaking vacuum) were also grown as control. A dramatic improvement in spin pumping over AlO$_x$ insertion layers was observed as shown in FIGS. 6A and 6B, which are graphs showing a dramatic improvement in spin pumping using NM insertion layers in accordance with an embodiment of the invention. FIG. 6A is a graph showing damping enhancement with an ultrathin Ti insertion layer. FIG. 6B is a graph showing the trend in Gilbert damping a values due to spin pumping with Ti insertion layer thickness. The Gilbert damping was found to be 0.045 and 0.043 respectively corresponding to 1 nm and 3 nm Ti insertion layers, which are close to the BT/NiFe value of 0.052. This corresponds to $g_{\uparrow\downarrow}$ values of $1.6\times10^{20}$ m$^{-2}$ and $1.5\times10^{20}$ m$^{-2}$ compared to $2.0\times10^{20}$ m$^{-2}$ respectively. These results show the preservation and possibility of enhancement of high-quality SOC properties of TI by capping the surface with a NM. This results in spin pumping due to spin-momentum locking in the topologically proximitized ultrathin NM: Ti in this case.

Figure 7A:
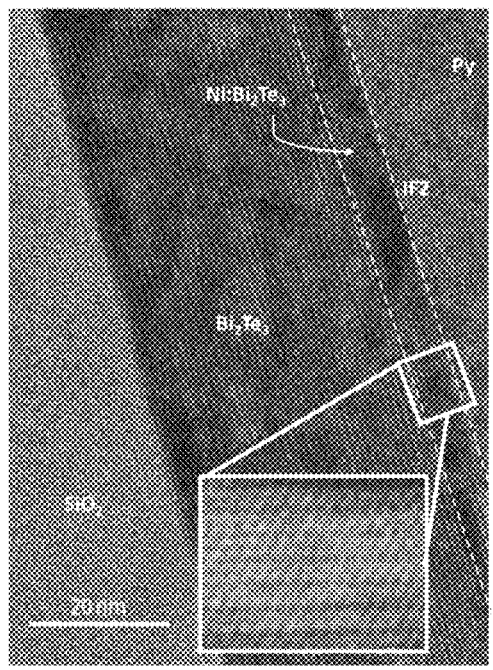
FIGS. 7A, 7B, and 7C are diagrams showing diffusion of Ni across the $Bi_2Te_3$/NiFe interface.
Figure 7B:
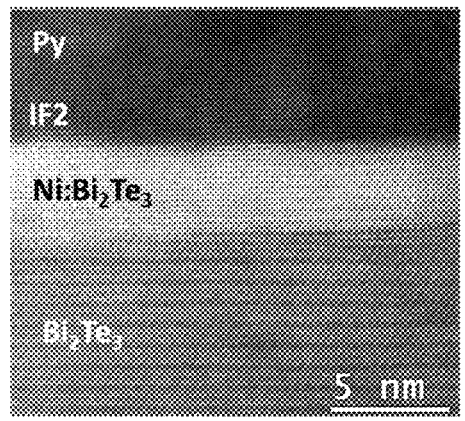
Figure 7C:
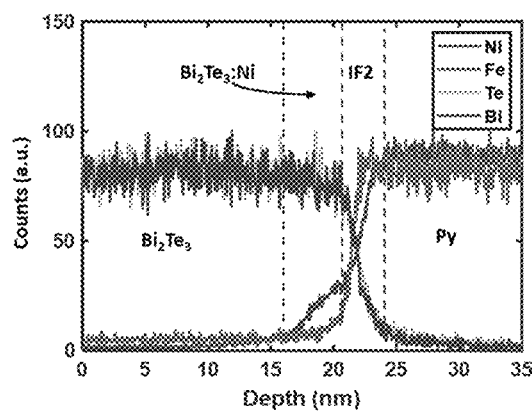
Figure 8:
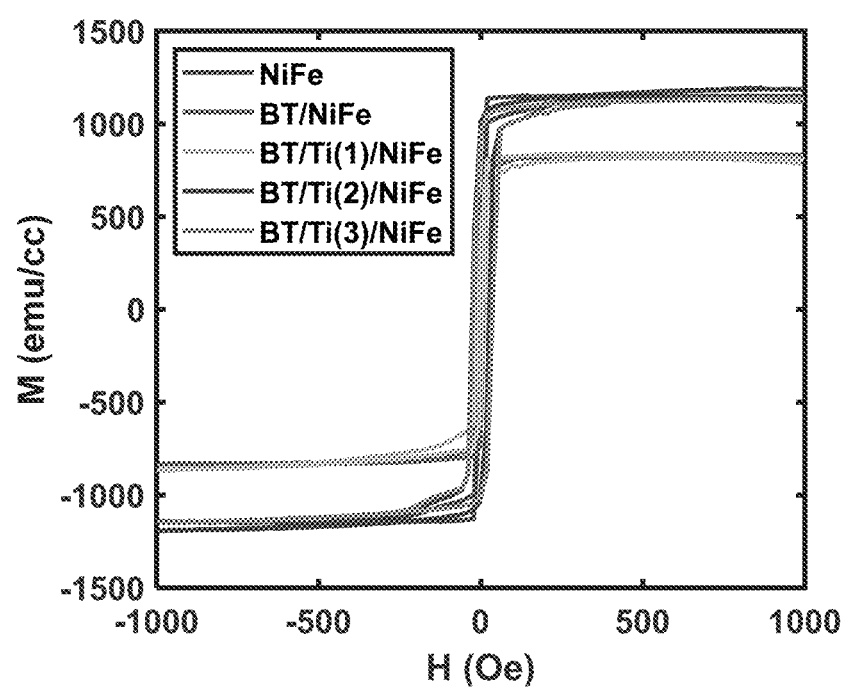
FIG. 8 is a graph showing VSM measurement results for BT/Ti(x=0, 1, 2, 3 nm)/NiFe heterostructures and a control sample of NiFe, in an experiment in accordance with an embodiment of the invention.

Experimental: Barrier Against Diffusion of Magnetic Species Across TI/FM Interface Bhattacharjee et al., [17] recently showed diffusion of Ni from NiFe alloy layer to TI using high-resolution transmission electron microscopy. The interface undergoes an intermediate phase transformation. Ni from NiFe diffuses into Bi$_2$Te$_3$ across interface and forms a distinct phase as shown in FIGS. 7A-7C. FIGS. 7A, 7B, and 7C are diagrams showing diffusion of Ni across the Bi$_2$Te$_3$/NiFe interface. FIG. 7A shows layers of Bi$_2$Te$_3$ and Py (an NiFe substance), along with an Ni:Bi$_2$Te$_3$ interface layer, at a scale of 20 nm; FIG. 7B shows the layers at a scale of 5 nm; and FIG. 7C is a graph of counts (a.u.) versus depth (nm) of Ni, Fe, Te, and Bi. As observed from M-H loop measurements using vibration sensing magnetometry (VSM) measurements (FIG. 8), the Bi$_2$Te$_3$/NiFe and Bi$_2$Te$_3$/Ti(1 nm)/NiFe samples showed reduced saturation magnetization, M$_s$ from ~5.5×10$^{-4}$ emu to 4×10$^{-4}$ emu. FIG. 8 is a graph showing VSM measurement results for BT/Ti(x=0, 1, 2, 3 nm)/NiFe heterostructures and a control sample of NiFe, in an experiment in accordance with an embodiment of the invention. This is possibly a combined effect of interlayer diffusion at the interface, formation of magnetic dead layers and proximity induced magnetization. A Ti barrier with thickness >2 nm consistently protects the interface against interdiffusions as the M$_s$ for the samples with 2 and 3 nm Ti insertion layers have the same Ms as the NiFe control sample of ~5.2×10$^{-4}$ emu. All the samples were deposited on 5 mm×6 mm Si/SiO$_2$ substrates with the same deposition recipe for NiFe to make an accurate comparison.

Figure 9A:
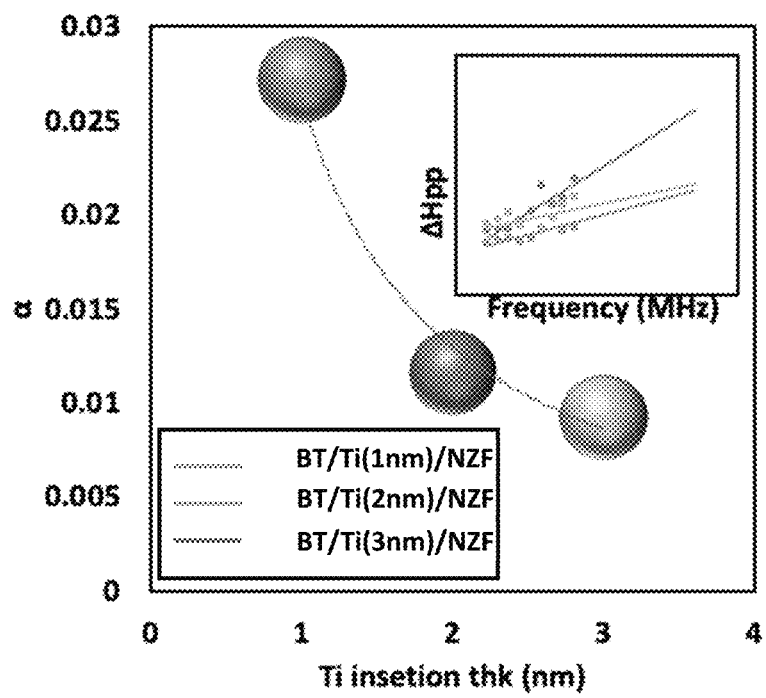
FIG. 9A is a graph showing the trend of Gilbert damping reduction with the increase in Ti thickness showing effect of spin-pumping, in an experiment in accordance with an embodiment of the invention. The inset shows linewidth vs frequency plots, coded for Ti insertion layer thickness.

Experimental: Demonstration of Spin Spray Ferrite Growth on TI/Ti Bilayer with Strong SOT To study the spin pumping effects on our spin spray NiZn-ferrite (NZFO) films, we deposited BT(10 nm)/Ti (x=1, 2, 3 nm)/NZFO (250 nm). The BT layer was grown at 250° C. followed by ultrathin Ti layers at room temperature before breaking vacuum on Si/SiO$_2$ substrate. We deposited 250 nm of NZFO using the low-temperature spin spray process at ~90° C. The gilbert damping extracted from the slope of FMR linewidth vs frequency clearly showed a smooth decreasing trend with the increase in Ti insertion layer thickness from 0.027 for the 1 nm Ti sample to 0.012 and 0.01 for Ti thickness of 2 nm and 3 nm, respectively as shown in FIG. 9A. FIG. 9A is a graph showing the trend of Gilbert damping reduction with the increase in Ti thickness showing effect of spin-pumping, in an experiment in accordance with an embodiment of the invention. The inset shows linewidth vs frequency plots, coded for Ti insertion layer thickness. The significantly enhanced Gilbert damping a at the 1 nm Ti insertion layer indicates a strong SOT in the TI/Ti (1 nm)/NZFO heterostructure. The decreasing trend in a with the increase in Ti insertion layer thickness suggests a trend in spin pumping in the TI/Ti multilayers and is similar to the trend observed in with NiFe as the FM layer. More accurate quantification of spin pumping and interfacial SML in TI/NM/NZFO heterostructures will be carried out using STFMR and ISHE experiments.

Figure 9B:
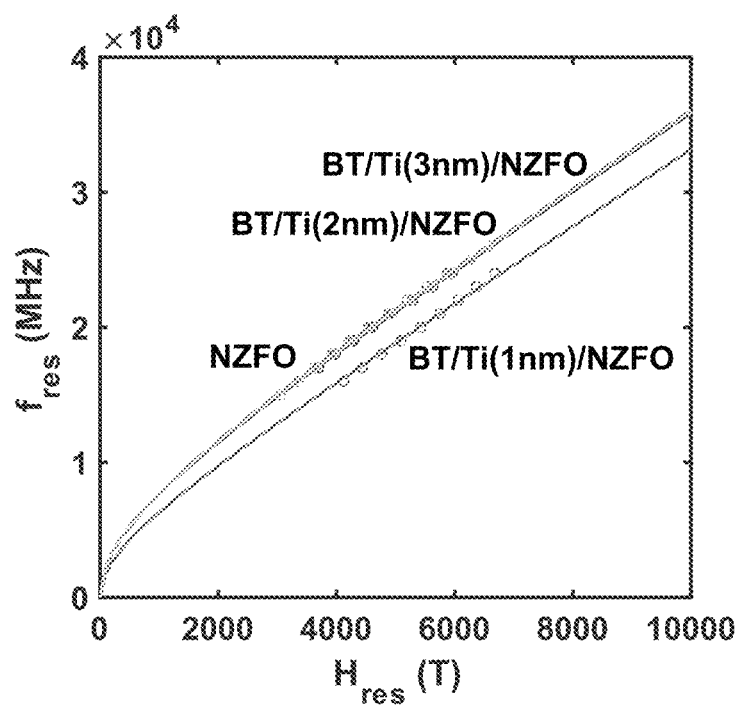
FIG. 9B is a graph showing resonance frequency vs resonance field fitted with Kittel equation, to extract $4\pi M_{eff}$ values, in an experiment in accordance with an embodiment of the invention.

Furthermore, using f vs $H_{res}$ fitting of Kittel equation we extracted the $4\pi M_{eff}$ values of the samples as shown in FIG. 9B. FIG. 9B is a graph showing resonance frequency vs resonance field fitted with Kittel equation, $f_{res}=\gamma H_{res}(H_{res}+ 4\pi M_{eff})$ to extract $4\pi M_{eff}$ values, in an experiment in accordance with an embodiment of the invention; with Ti insertion layer thicknesses of 1, 2 and 3 nm. The induced interface anisotropy field calculated using the equation $H_{int}= (4\pi M_{eff}^{NZFO}-4\pi M_{eff}^{BT\backslash Ti\backslash NZFO})$ gives a high OOP anisotropy field of 2.36 kOe for the sample with 1 nm Ti insertion layer. With the increase in Ti insertion layer thickness to 2 and 3 nm, the $H_{int}$ falls to very low values of −192 Oe and −112 Oe, respectively, which shows reduced proximity induced magnetization and resulting magnetic anisotropy at the interface. The Gilbert damping values show a decreasing trend as expected from the increase in insertion layer thickness, suggesting spin pumping from the NZFO layer to the TI.

CONCLUSION

NM coupled to a TI shows fascinating proximity induced SOC effects which have been reported theoretically and we observed in our magnetic characterization experiments using BT/Ti heterostructures. These TI/NM heterostructures solve three problems associated with TI based spintronic devices: (1) Dramatic reduction of power dissipation due to presence of a NM conduction channel with proximity induced SOC properties; (2) Barrier against migration of magnetic species when metallic alloy based FM is used; (3) Enabling growth of low temperature MI using spin spray technique which requires exposure of the substrate to atmosphere. The fascinating physics governing the spin-dependent electronic properties of TI/NM heterostructures also make them optimal spin-Hall materials for SOT devices and provides a path towards commercialization of highly energy efficient TI based SOT-MRAMs. Heterostructures taught herein can, for example, be used to create SOT nonvolatile memory devices, such as SOT-MRAMs; SOT based power efficient logic devices; and high frequency spin torque nano oscillator (STNO) devices.

Definitions

As used herein, a "normal metal" is a nonmagnetic metal with low spin orbit coupling (SOC) and large spin transparency. For example, at least one of titanium and copper, using thicknesses taught herein, can be used as a normal metal layer.

As used herein, a "topological insulator" is a material that behaves as an insulator in its interior but whose surface contains conducting states. Topological insulators have non-trivial symmetry-protected topological order. Their surface states are symmetry-protected Dirac fermions by particle number conservation and time-reversal symmetry. The topological insulators used herein can be three-dimensional (3D) topological insulators, in which there are four Z-2 topological invariants, which define the ground state, and which differentiate the insulator from "weak" and "strong" topological insulators. For example, the topological insulator can include a first metal comprising at least one of bismuth and antimony, and a second metal comprising at least one of tellurium and selenium; for example, it can belong to the family $(Bi,Sb)_2(Te,Se)_3$. In one example, the topological insulator can be bismuth telluride $(Bi_2Te_3)$, or another $Bi_xTe_{(1-x)}$ material, for x being a suitable value with $0<x<1$.

REFERENCES

1. J. C. Sloncewski, JMMM, Vol 159, Issue 1-2, (1996).
2. L. Berger et al., Phys. Rev. B 54, 9353, 1996.
3. A. Fert et al., PRL 106, 157208, 2011.
4. T. Chen, et al., Proceedings of the IEEE, vol. 104, no. 10, pp. 1919-1945, 2016.
5. A. Manchon et al., Nature Materials Vol 14, 871-882, 2015.
6. F. Khatmis et al., Nature 533, 513, 2016.
7. J. Kim et al., PRL 119, 027201 2017.
8. L. Liu et al., Science Vol 336, 2012.
9. M. B. Jungfleisch et al., Physical Review B 93, 224419, 2016.
10. A. R. Mellnik et al., Nature, Vol 511, 449, 2014.
11. Mahendra D. C et al., Nature Materials, Vol 17, 800, 2018.
12. Mahendra D. C et al., Appl. Phys. Lett. 114, 102401, 2019.
13. Zhu et al., PRL 12, 051002 (2019).
14. Wu et al., PRL 123, 207205 (2019).
15. Siegal et al., APL 110, 141905, 2017.
16. Buha et al., Nano Lett. 16, 7, 4217-4223, 2016.
17. Bhattacharjee et al, arXiv:2110.02845, 2021.
18. S. Emori et al., Phys. Lett. 112, 182406 (2018).
19. Zutic et al., Materials Today, Vol 22, Pages 85-107, 2019.
20. Essert et al., New J. Phys. 16, 113058, 2014.
21. Shoman et al., Nature Comm 6:6547, 2015.
22. M. Abe et al., Jpn. J. Appl. Phys., 22, L511, (1983).
23. M. Abe et al., J. Appl. Phys., 63, 3774 (1988).
24. D. Kong et al., ACS Nano 2011, 5, 6, 4698-4703.
25. N. Bhattacharjee et al., ELO3.06.29: Enhanced Gilbert Damping in Sputter Deposited Topological Insulator/Ferromagnet Heterostructures, M R S 2019.
26. L. Liu et al., Phys. Rev. B 91, 235437, 2015.
27. H. Y. Lee et al., APL Mater. 7, 031110, 2019.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

What is claimed is:
1. A thin film heterostructure material for a spin orbit torque device, the material comprising:
   a topological insulator sputter deposited on a substrate;
   an adjacent ferromagnetic material; and
   a normal metal sputter deposited in proximity to the topological insulator and forming a barrier between the adjacent ferromagnetic material and the topological insulator to prevent diffusion of material from the adjacent ferromagnetic material into the topological insulator towards the substrate, wherein the normal metal is a pure titanium layer or a layer comprising copper;

the topological insulator and normal metal together being configured to provide spin-orbit torque to the adjacent ferromagnetic material sufficient to produce at least one of resonant excitation and switching of magnetization in the ferromagnetic material.

2. The thin film heterostructure material of claim 1, wherein the topological insulator comprises a first element comprising at least one of bismuth and antimony, and a second element comprising at least one of tellurium and selenium.

3. The thin film heterostructure material of claim 2, wherein the topological insulator comprises bismuth telluride ($Bi_2Te_3$).

4. The thin film heterostructure material of claim 1, wherein the normal metal comprises a thickness that is sufficiently thick to prevent diffusion of material from the adjacent ferromagnetic material into the topological insulator towards the substrate, and the thickness being sufficiently thin to permit spin orbit coupling of the heterostructure material with the adjacent ferromagnetic material.

5. The thin film heterostructure material of claim 4, wherein the normal metal comprises a thickness that is greater than about 1 nm and less than about 5 nm.

6. The thin film heterostructure material of claim 1, further comprising a magnetic insulator or antiferromagnetic insulator spin-spray deposited on the heterostructure material.

7. The thin film heterostructure material of claim 1, wherein the adjacent ferromagnetic material comprises at least one of: cobalt ferrite boron (CoFeB) and a material comprising nickel and iron.

8. The thin film heterostructure material of claim 1, wherein the adjacent ferromagnetic material comprises at least a portion of a nonvolatile memory device.

9. The thin film heterostructure material of claim 8, wherein the nonvolatile memory device comprises a Magnetic Random Access Memory (MRAM) device.

10. The thin film heterostructure material of claim 1, wherein the adjacent ferromagnetic material comprises at least a portion of a Complementary Metal Oxide Semiconductor (CMOS) device.

* * * * *